US011482433B2

(12) United States Patent
Sagar et al.

(10) Patent No.: US 11,482,433 B2
(45) Date of Patent: Oct. 25, 2022

(54) STACKED THERMAL PROCESSING CHAMBER MODULES FOR REMOTE RADIATIVE HEATING IN SEMICONDUCTOR DEVICE MANUFACTURE

(71) Applicant: Intel Corporation, Santa Clara, CA (US)

(72) Inventors: Ashutosh Sagar, Hillsboro, OR (US); Chao-Kai Liang, Hillsboro, OR (US); Miye Hopkins, Hillsboro, OR (US); Weimin Han, Portland, OR (US); Robert James, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 16/932,594

(22) Filed: Jul. 17, 2020

(65) Prior Publication Data

US 2022/0020613 A1  Jan. 20, 2022

(51) Int. Cl.
*H01L 21/67* (2006.01)
*H05B 6/70* (2006.01)
*H01L 21/677* (2006.01)

(52) U.S. Cl.
CPC ........ *H01L 21/67115* (2013.01); *H05B 6/707* (2013.01); *H01L 21/67109* (2013.01); *H01L 21/67178* (2013.01); *H01L 21/67742* (2013.01)

(58) Field of Classification Search
CPC ......... H01L 21/67178; H01L 21/67115; H01L 21/67109; H01L 21/67742; H01L 21/6719; H01L 21/68785; H05B 6/707
See application file for complete search history.

(56) References Cited

U.S. PATENT DOCUMENTS

| | | | | |
|---|---|---|---|---|
| 11,367,634 B2 * | 6/2022 | Kwon | ............... | H01L 21/68764 |
| 2010/0192844 A1 * | 8/2010 | Kim | .................... | G03F 7/70341 |
| | | | | 118/69 |
| 2015/0136759 A1 * | 5/2015 | Ikeda | ................ | H01L 21/67115 |
| | | | | 219/754 |
| 2016/0274469 A1 * | 9/2016 | Yamaoka | .......... | H01L 21/67178 |
| 2017/0135163 A1 * | 5/2017 | Chang | ................ | H01L 21/6776 |
| 2018/0122663 A1 * | 5/2018 | Huang | ............... | H01L 21/2686 |
| 2019/0182915 A1 * | 6/2019 | Hirochi | .................... | H05B 6/68 |
| 2021/0059017 A1 * | 2/2021 | Koh | ....................... | H05B 1/0233 |
| 2021/0407865 A1 * | 12/2021 | Shinozaki | ............. | F27D 5/0037 |
| 2022/0020613 A1 * | 1/2022 | Sagar | ................ | H01L 21/67178 |
| 2022/0093435 A1 * | 3/2022 | Shinozaki | ......... | H01L 21/67323 |

* cited by examiner

*Primary Examiner* — Jarrett J Stark
(74) *Attorney, Agent, or Firm* — Essential Patents Group, LLP

(57) ABSTRACT

Stacked thermal process chamber module for remote radiative heating of semiconductor device workpieces. A stacked thermal process module may include a stack of thermal process chambers and one or more generators of electromagnetic radiation. The electromagnetic radiation may be transported from a generator remote from the process chambers through one or more waveguides, thereby minimizing the volume and/or cleanroom footprint of the stacked thermal process chamber module. A waveguide may terminate in a process chamber so that electromagnetic radiation delivered during a thermal process may be coupled into one or more materials of the workpiece. The radiative heating process may overcome many of the limitations of thermal process chambers that instead employ a local heat source located within a process chamber.

12 Claims, 7 Drawing Sheets

STACKED THERMAL PROCESSING CHAMBER MODULES FOR REMOTE RADIATIVE HEATING IN SEMICONDUCTOR DEVICE MANUFACTURE

BACKGROUND

Demand for higher performance integrated circuits (ICs) in electronic device applications has motivated increasingly complex transistor architectures. This greater chip complexity requires more processing, placing greater demands on semiconductor manufacturing cleanroom fab capacity. The number of semiconductor device wafers processed per square foot of cleanroom fab area therefore needs to scale on pace with IC device feature size reductions. Hence, not only is IC chip density increasing with successive process technology nodes, chipmakers are increasing IC chip output density.

Many operations performed in the manufacture of semiconductor devices entail a thermal process in which workpieces (e.g., wafers or panels) are heated to temperatures well above room temperature. Such thermal cures have conventionally employed a heat source that is in close proximity, or "local," to the workpiece. A resistively heated pedestal upon which a workpiece rests while being heated is one example of a local heat source. An IR heat lamp, which radiatively heats a workpiece (e.g., through vibrational mode coupling) when placed in near contact with the lamp, is another example of a local heat source. A process chamber for such thermal cure must therefore be large enough to house both the workpiece and the local heater element(s). Local heat sources, however, can be physically large and therefore significantly constrain efforts to reduce the thermal process chamber size and/or the thermal process chamber platform footprint. Being a function of the size of the chamber and/or the footprint of the chamber platform, cost of ownership of such thermal processing tools is also constrained.

Thermal processing platforms that overcome one or more of these limitations may advantageously increase IC chip output density.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
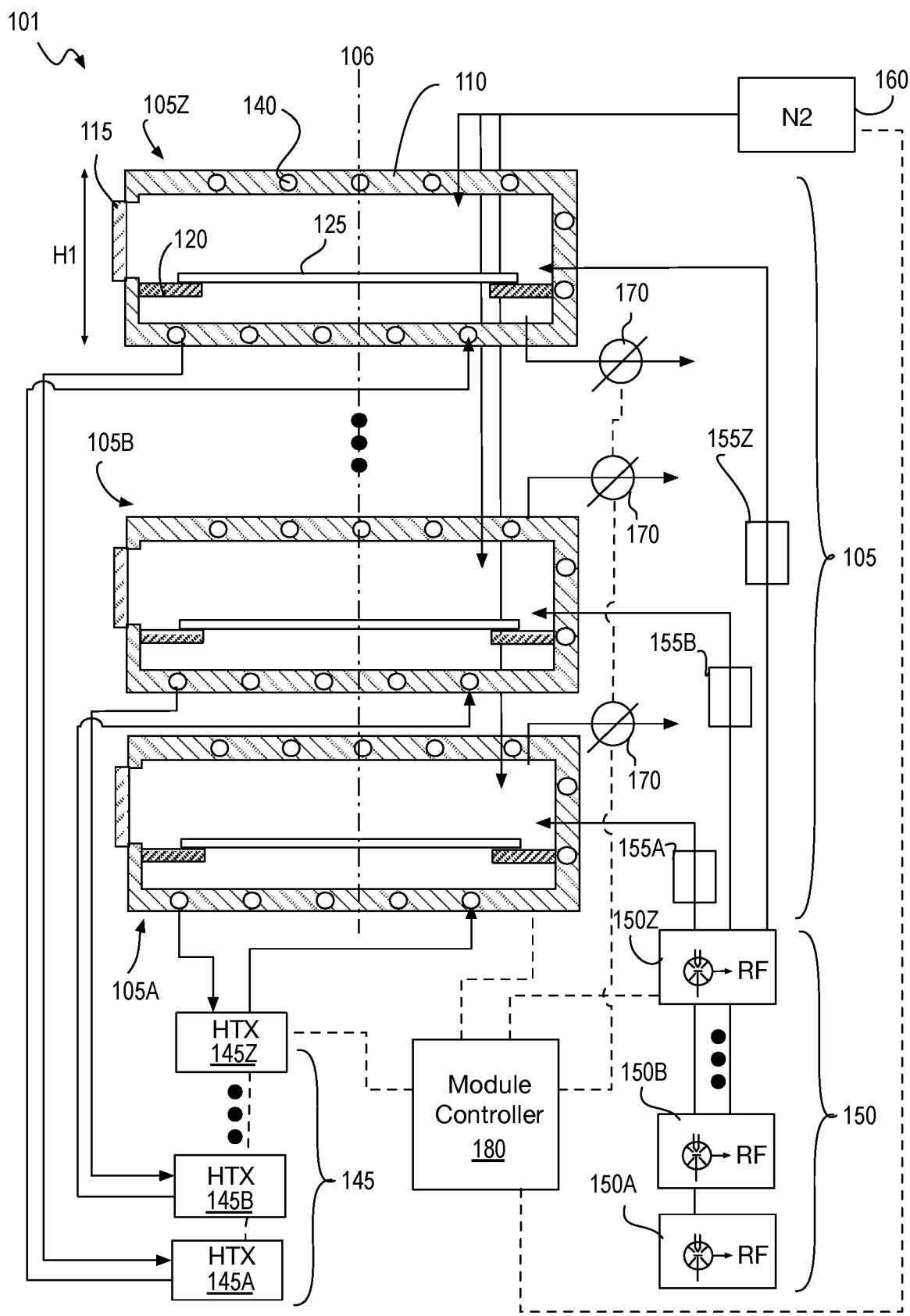
FIG. 1 is a schematic of a stacked thermal process chamber module for remote radiative heating of semiconductor device workpieces, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or may have one or more intervening materials or layers. Moreover, one material disposed between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Examples of a stacked thermal process chamber module for remote radiative heating of semiconductor device workpieces are described below. A stacked thermal process module may include a stack of thermal process chambers and one or more generators of electromagnetic radiation remote of the stack of thermal process chambers. With remote placement of the generators, the volume and/or cleanroom footprint of the stacked thermal process chamber module may be reduced. Electromagnetic radiation of particular wavelengths may be readily propagated from a generator located some significant distance away from the process chambers, for example outside of a cleanroom. Electromagnetic radiation within at least in the microwave band may be propagated many tens, or even hundreds, of meters through a waveguide and undergo little loss of field strength. Such a waveguide may be terminated in a thermal process chamber. Electromagnetic radiation propagated from the remote source during a thermal process may be coupled into one or more materials of a workpiece susceptible to electromagnetic heating, for example through radiative mechanisms including molecular rotation and/or ionic conduction that transform the radiation into thermal energy responsible for thermally processing the workpiece.

The radiative heating processes of the industrial ovens described herein may overcome many of the limitations of thermal process chambers that instead employ a local heat source (i.e., located within a process chamber). For example, a thermal process chamber coupled to a remote microwave generator (i.e., magnetron) may be just large enough to contain a single workpiece within its interior, and to permit automated handling (loading/unloading) of the workpiece between thermal processes. Having minimal vertical dimensions (e.g., ~10-20 cm), a stacked thermal process module capable of processing may workpieces concurrently may include a plurality of such thermal process chambers stacked one atop another, minimizing the footprint of the multi-chamber module and increasing IC output density.

With a compact thermal process chamber, thermal mass of the chamber may also be minimized, affording greater temperature control and lower thermal cross-talk between adjacent chambers. Where strong electromagnetic coupling is achieved, workpiece heating efficiencies may be improved, reducing total power consumption associated with a thermal process. Workpiece heating may also be selective to only certain material or regions within a workpiece. One or more of these advantages may reduce the cost of ownership of a remotely heated thermal processing platform to well below that of a conventional platform employing a heater within the process chamber.

FIG. 1 is a schematic of a stacked thermal process chamber module 101 for remote heating of semiconductor device workpieces, in accordance with some embodiments. Chamber module 101 includes a vertical stack of a plurality of process chambers 105. In the illustrate example, the plurality of chambers 105 includes a process chamber 105A, a process chamber 105B over process chamber 105A, and a process chamber 105Z over both process chambers 105A and 105B. There may be any integer number of additional process chambers between process chamber 105B and process chamber 105Z. In some embodiments, process chamber module 101 includes at least six process chambers stacked one upon the other. As shown, process chambers 105A-105Z are substantially aligned along a single chamber stack axis 106. However, stack process chambers may also be laterally displaced from one another (e.g., staggered or staircased).

Stacked thermal process chamber module 101 further includes one or more electromagnetic wave generators 150 external of the stack of a plurality of process chambers 105. In other words, the volume of space occupied by generators 150 is remote from the volume of space occupied by the plurality of process chambers 105. The volume of space occupied by the plurality of process chambers 105 may therefore be minimized, for example with each process chamber having a vertical height H1 sufficient for the loading and unloading of a single workpiece 125 into the interior of the chamber. In the exemplary embodiment illustrated, generators 150 include a generator 150A, a generator 150B and a generator 150Z. There may be any integer number of generators between generator 150B and generator 150Z. In some exemplary embodiments, process chamber module 101 includes one generator for each process chamber such that the number of generators 150 is equal to the number of process chambers 105. With this configuration, the process chambers 105 may concurrently operate in parallel and at any number of different process conditions (different power levels, frequency bands).

Generators 150 may generate electromagnetic waves of any center frequency, any bandwidth, and any at any power level suitable for radiatively heating workpiece 125. Radiative heating of workpiece 125 may result from the coupling of electromagnetic energy into one or more materials of workpiece 125, which directly heats workpiece 125. Alternatively, radiative heating of workpiece 125 may result from the coupling of electromagnetic energy into one or more materials of a process chamber, which then transfer heat to workpiece 125 (e.g., through conduction/convection). The coupling of electromagnetic energy of longer wavelengths into a material may be through molecular rotation. The coupling may also be through ionic conduction, or both modes of coupling may also occur, depending upon the material and the electromagnetic energy.

In some embodiments, generators 150 comprise a magnetron that outputs a wave within the microwave band (e.g., 300 MHz-300 GHz). Generators 150 may output over a narrower predetermined band of the microwave frequency range, such as between about 500 MHz and 12 GHz (e.g., within L, S, C, or X bands). In some advantageous embodiments, generators 150 output electromagnetic energy having a center frequency at one or more microwave frequencies designated for industrial use, such as, but not limited to 915 MHz, or 2.54 GHz. Although the microwave band is suitable for radiatively heating a variety of materials that may be found in a semiconductor device workpiece, generators 150 may be controlled to output at a particular center frequency based on the particular dipoles or ions present within a particular material targeted for heating. As such, the center frequency at which generators 150 operate during a thermal process may be controlled within some band based on changes in the workpiece composition between different stages of an IC fabrication process.

One or more waveguides couple an electromagnetic wave output by the generator(s) to an input of the stacked thermal process chambers. In the illustrated example, an output of generator 150A is coupled to process chamber 105A through waveguide 155A. An output of generator 150B is coupled to process chamber 105B through waveguide 155B, and an output of generator 150Z is likewise coupled to process chamber 105Z through waveguide 155Z. Waveguides 155A-Z may have any cross-sectional geometry suitable for supporting various modes of the electromagnetic waves synthesized by generators 150. For example, waveguides 155A-Z may have a rectangular cross-section with an h-plane and an e-plane. Cross-sectional dimensions of waveguides 155A-Z may vary to have low loss for a specific frequency band. Waveguides 155A-Z may span a significant distance between process chambers 105 and generator 150. For example, in some embodiments, waveguides 155A-Z may have a length that is at least ten meters, and may be many tens of meters. Waveguides 155A-Z may also have one or more bends (e-bends and/or h-bends) and/or twists between straight waveguide runs.

As illustrated for process chamber 105N, each of the process chambers 105 includes a chamber wall 110 partially enclosing an interior space within which workpiece 125 is contained during a thermal process. Each process chamber further includes a chamber door 115, which may gate a passage in chamber wall 110 though which workpiece 125 is passed to and from an interior of process chamber 105N Chamber door 115 may be closed during thermal processing and open during workpiece transfer Chamber wall 110 and chamber door 115 may each comprise any structural material suitable for the application, such as, but not limited to, aluminum, stainless steel, quartz, ceramic, or the like. In some advantageous embodiments, at least an interior surface of chamber wall 110 is reflective of electromagnetic energy conveyed by waveguide 155N. In some further embodiments, both chamber wall 110 and chamber door 115 are reflective of the electromagnetic energy conveyed by waveguide 155N such that a process chamber may absorb very little electromagnetic energy and therefore is not itself strongly heated through exposure to the electromagnetic energy.

Although chamber wall 110 may absorb little of the electromagnetic radiation output by generator 150, in some embodiments one or more coolant fluid conduits 140 are thermally coupled to chambers walls 110. Coolant fluid conduits 140 may be embedded within chamber wall 110, as illustrated, or may otherwise thermally coupled with at least an exterior surface of chamber wall 110. Coolant fluid conduits 140 may convey any coolant fluid known to be suitable for the application, such as, but not limited, a glycol/water mix. Coolant fluid conduits 140 are part of one or more coolant fluid loops that are driven by one or more heat exchangers 145.

Heat exchanger 145 may be operated as a chiller, for example maintaining a coolant fluid temperature of no more than 30° C. so that heat transferred through coolant fluid channels 140 may be extracted to avoid gradual drifts in the temperature of chamber wall 110 and/or to provide thermal isolation between adjacent chambers. As illustrated in FIG. 1, heat exchangers 145 include one heat exchanger for each thermal process chamber (e.g., with heat exchanger 145A driving a coolant loop coupled to process chamber 105A, heat exchanger 145B driving a coolant loop coupled to process chamber 105A, and heat exchanger 145Z driving a coolant loop coupled to process chamber 105Z. In other embodiments, a single heat exchanger may drive a coolant loop coupled to more than one process chamber. For example, a thermal process module comprising a stack of thermal process chambers may include only one heat exchanger with all of the process chambers of the module plumbed in series, in parallel, or in counter current configurations.

As further illustrated in FIG. 1, within process chambers 105 there is a workpiece support structure 120 that is to support workpiece 125 during a thermal process. In some embodiments, workpiece support structure 120 also comprises a material that does not strongly couple to electromagnetic radiation entering the chamber. Workpiece support structure 120 may also have a low thermal mass and/or overlap only a small portion of workpiece 125. Overlap between support structure 120 and workpiece 125 may reduce thermal conduction between two and/or facilitate even radiative heating of workpiece 125. In some embodiments, for example, workpiece support structure 120 overlaps less than 30% of the area of backside surface of workpiece 125. Overlap area between workpiece support structure 120 and workpiece 125 may even be less than 1% of the backside surface area of workpiece 125. While a low overlap (contact) area and/or low thermal mass would not be suitable for a pedestal designed to include a local resistive heater, remotely sourced radiative heating enables workpiece support structure 120 to occupy very little volume within the process chamber.

One or more process gases may be supplied into a thermal process chamber during a remote radiative thermal process. In some embodiments, process gas panel 160 includes at least nitrogen as a source/process gas. In further embodiments, process gases panel 160 includes $H_2$, for example in the form of a $H_2$:$N_2$ forming gas. Process gas panel 160 may also include any other source gases known to be suitable for thermal processing, such as, but not limited to, $NH_3$ or $O_2$.

Pressure within process chambers 105 during a thermal process may be controlled through flowrate control (e.g., mass flow controller) at process gas panel 160 in combination with control of an exhaust valve 170 to gate gaseous exhaust from process chamber 105. In some embodiments, exhaust valve 170 outputs to an exhaust scrubber operating at ambient pressure (e.g., 1.0 std atm). In other embodiments, exhaust valve 170 is backed by one or more exhaust pumps. Process chambers 105 may therefore operate over a range of pressures. In some embodiments, process chambers 105 are maintained with a range of 0.5-1.5 std atm during a thermal process. In some such embodiments, process chambers 105 are maintained at approximately 1.0 std atm during a thermal process. At these pressures, the electromagnetic energy supplied by generators 150 will not ionize process gases 160, with the electromagnetic energy instead heating workpiece 125.

As further illustrated in FIG. 1, the various components of stacked thermal process module 101 are controlled and operated in a concerted manner by module controller 180 to perform a plurality of concurrent thermal processes. Module controller 180 may comprise any computer platform executing any suitable module control software. In the example shown, module controller 180 is communicatively coupled (as denoted by dashed lines) to each of process chamber 105, generators 150, heat exchangers 145, process gases 160, and exhaust valves 170. In exemplary embodiments, module controller 180 is to execute instructions stored on a computer readable media to implement one or more thermal processes on workpieces 125, for example substantially as described elsewhere herein.

Figure 2A:
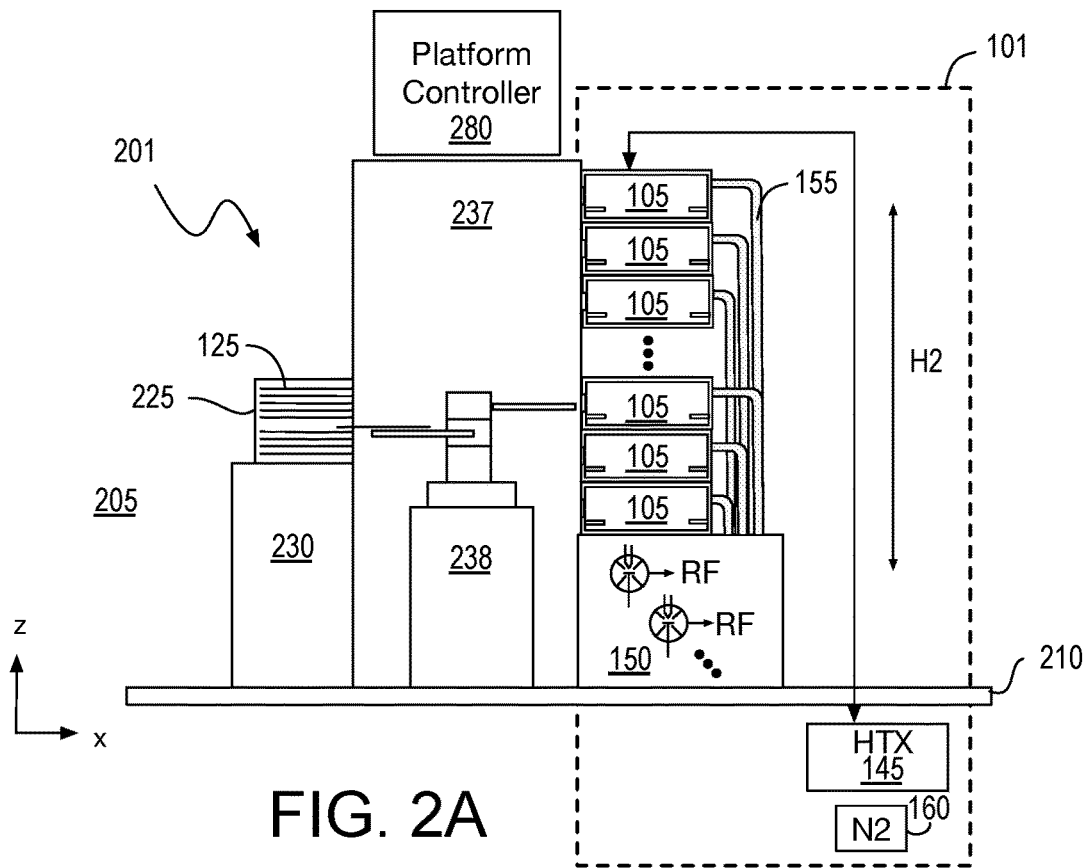
FIG. 2A is a side view of a thermal processing platform comprising the stacked thermal process chamber module illustrated in FIG. 1, in accordance with some embodiments.

FIG. 2A is a side view of a thermal process platform 201 comprising stacked thermal process chamber module 101, in accordance with some embodiments. Thermal process platform 201 occupies a footprint of a floor 210 within a cleanroom 205. Thermal process platform 201 includes a load port 230 that is to receive a carrier or pod 225 containing a plurality of workpieces 125. Load port 230 is mechanically coupled to a transfer module 237 that includes a robotic handler 238. Robotic handler 238 is to transfer a workpiece 125 to, and from, load port 230 and stacked process chamber module 101. Robotic handler 238 may include one or more articulating arms suitable for transferring a workpiece 125 between load port 230 and any thermal process chamber 105.

Thermal process platform 201 further includes a platform controller 280 comprising one or more computer suitable for executing a machine control software application. In some embodiments, platform controller 280 is communicatively coupled to each of load port 230, robotic handler 238, and stacked thermal process chamber 101. Platform controller 280 may execute instructions stored on a machine readable media to control in concert each of load port 230, robotic handler 238, and stacked thermal process chamber 101. In some embodiments, platform controller 280 includes thermal process module controller 180 (FIG. 1). In other embodiments, platform controller 280 is communicatively coupled to, and interfaces with, thermal process module controller 180.

In the example illustrated, stacked thermal process module 101 includes at least six thermal process chambers 105 in a stack supported by a housing containing a plurality of generators 150. Waveguides 155 extend a vertical distance H2 between individual ones of the process chambers 105 and individual ones of generators 150. In some exemplary embodiments where the vertical (e.g., z-dimension) height of each of process chambers 105 is around 20 cm, or less, vertical distance H2 may be 2 meters, or less. As shown, the footprint of process chambers 105 and waveguides 155 is substantially equal to that of generators 150 so that the footprint of thermal process platform 201 is equal to the sum of the cleanroom footprint of load port 230, transfer module 237 and generators 150. Heat exchangers 145 and source gases 160 are remotely located outside of cleanroom 205, and in this specific example, are below cleanroom floor 210 (i.e., within a sub-fab area).

Figure 2B:
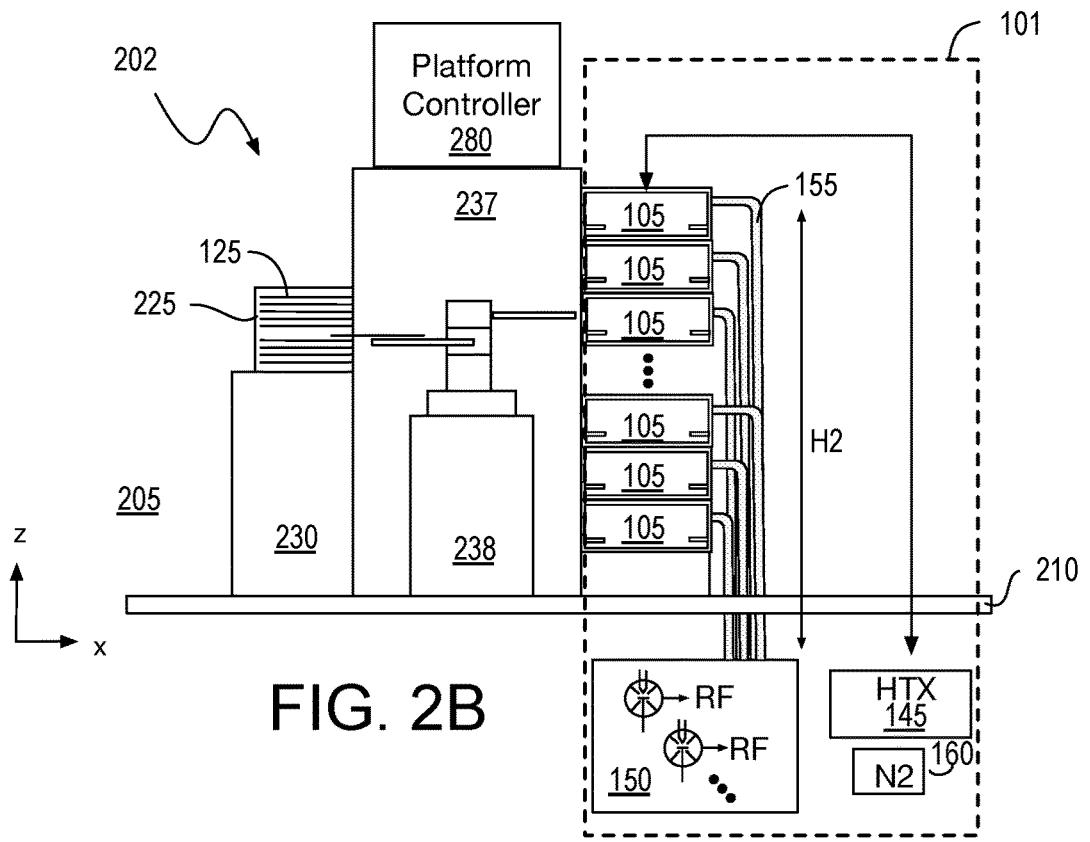
FIG. 2B is a side view of a thermal process platform comprising the stacked thermal process chamber module illustrated in FIG. 1, in accordance with some alternate embodiments.

FIG. 2B is a side view of a thermal process platform 202 comprising stacked thermal process chamber module 101, in accordance with some alternate embodiments. Thermal process platform 202 similarly includes load port 230 mechanically coupled to transfer module 237 that includes robotic handler 238. In this example, stacked thermal process module 101 again includes at least six thermal process chambers 105 in a stack. Generators 150 are however located outside of cleanroom 205, and in this specific example, are below cleanroom floor 210. Waveguides 155 therefore extend a greater vertical distance H2 between individual ones of the process chambers 105 and individual ones of generators 150. In some exemplary embodiments, vertical distance H2 is 3 meters, or more. The cleanroom footprint of stacked thermal process module 101 is substantially equal to the footprint of one process chamber 105 so that the footprint of thermal process platform 201 is then equal to the sum of the cleanroom footprint of load port 230, transfer module 237 and one process chamber 105. Heat exchangers 145 and source gases 160 are again remotely located outside of cleanroom 205, below cleanroom floor 210.

Figure 3:
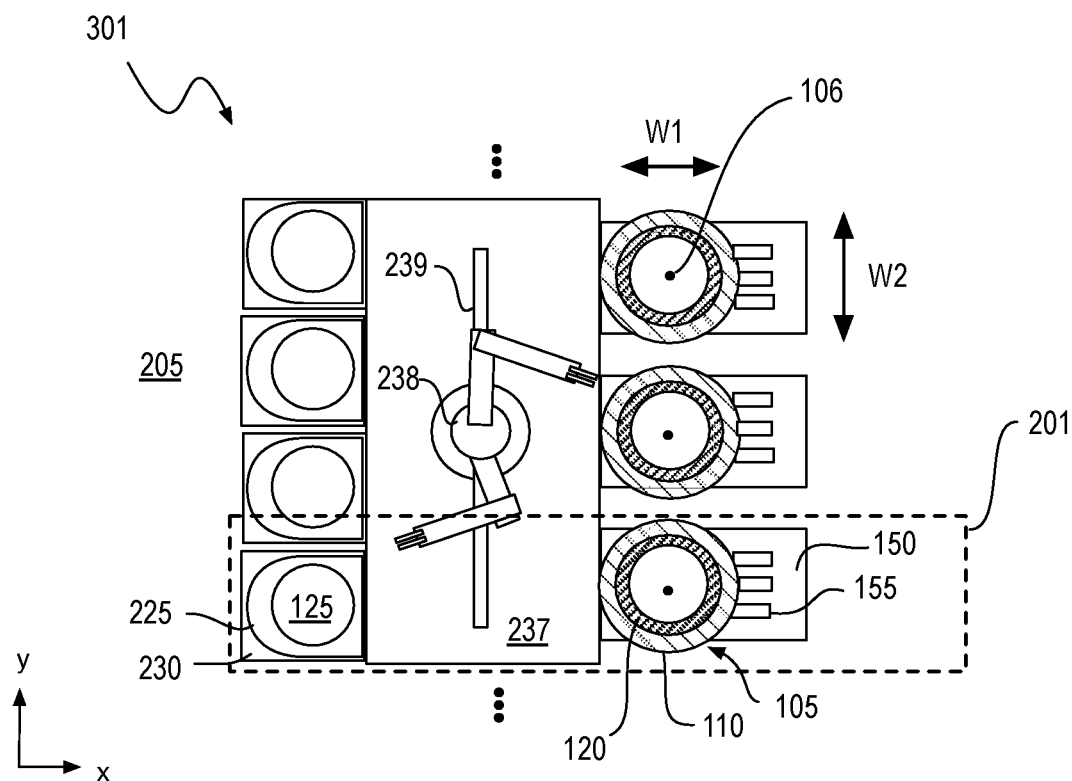
FIG. 3 is a plan view of a thermal process platform including a plurality of the stacked thermal process chamber modules illustrated in FIG. 2A, in accordance with some embodiments.

FIG. 3 is a plan view of a thermal process platform 301 including a plurality of stacked thermal process chamber modules 101, in accordance with some embodiments. Thermal process platform 301 includes a plurality of thermal process platforms 201 (denoted in dashed line) arranged into a linear array within cleanroom 205. Thermal process platform 301 is merely one example of how stacked thermal process chamber modules may be clustered to further increase IC output density. As shown, three stacked thermal process chamber modules 101 are positioned within a linear array (e.g., along y-axis) along a first side of transfer module 237. Any integer number of stacked thermal process chamber modules 101 may be similarly arranged. Robotic handler 238 is supported on a linear bearing 239 of any length needed to access each of the adjacent stacked thermal process modules 101 so that workpieces may be transferred to and from any process chamber 105 within any of the stacked thermal process chamber modules 101. Any integer number of load ports 230 is similarly linearly arrayed along an opposite side of transfer module 237. Optionally, one or more stacked thermal process chamber modules 101 or load ports 230 may be further positioned at opposite ends of transfer module 237 to arrive at a suitable mix of workpiece supply and thermal process chamber capacity.

As illustrated in FIG. 3, all thermal process chambers 105 within one stacked thermal process chamber module 101 are aligned along central axis 106. In the illustrated example workpiece 125 is a wafer and thermal process chambers 105 have a substantially circular footprint with a radius from central axis 106 that is larger than a radius of workpiece 125, for example by 10-20 cm. Within chamber wall 110, workpiece support structure 120 is an annulus, or ring having an outer diameter smaller than an inner diameter of chamber wall 110. Thermal process chambers 105 may instead have a substantially rectangular footprint, or some other polygonal footprint. Regardless of the specific shape, in some embodiments thermal process chamber has a footprint of no more than x-dimensional width W1 multiplied by y-dimensional width W2. In exemplary embodiments, thermal process chamber 105 has a footprint of no greater than twice the area of workpiece 125. Accordingly, in some embodiments each stack of thermal process chambers 105 may be no larger than the footprint of a load port 230.

Figure 4A:
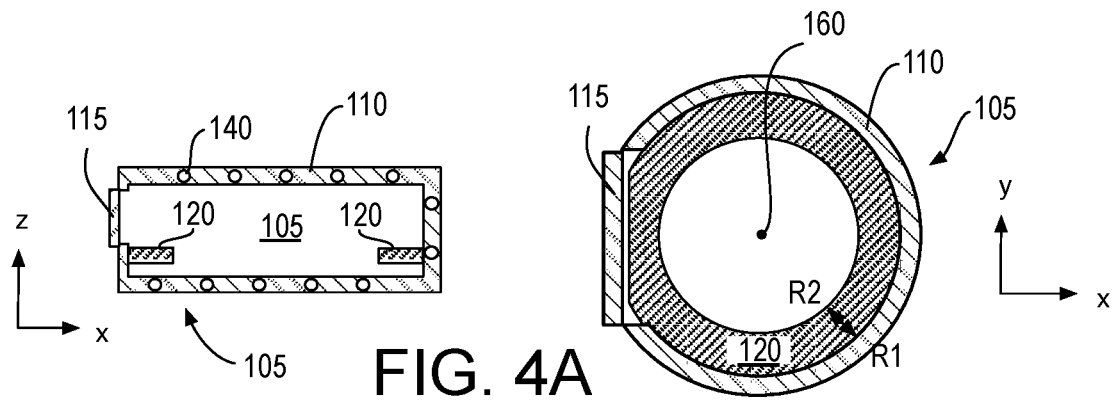
FIGS. 4A, 4B, 4C and 4D illustrate cross-sectional and plan views of thermal process chambers including some exemplary workpiece support structures suitable for remote radiative heating of semiconductor device workpieces, in accordance with some embodiments.

FIGS. 4A-4D illustrate cross-sectional and plan views of thermal process chambers including some exemplary workpiece support structures suitable for remote radiative heating of semiconductor device workpieces, in accordance with some embodiments. FIG. 4A further illustrates workpiece support structure 120, which includes an annulus or ring having an outer radius R1 smaller than an inner diameter of chamber wall 110, and an inner radius R2 smaller than a radius of a substantially circular workpiece. In some exemplary embodiments, inner radius R2 is a few tens of millimeters smaller than the radius of workpiece 125 so that the ring is to overlap a workpiece by less than 30% of the surface area of workpiece. Within minimal overlap, workpiece support structure 120 will have minimal contact with a workpiece resulting in a high thermal resistance that may limit thermal gradients along a radius of the workpiece during a thermal process. Workpiece support structure 120 also leaves an interior area of a workpiece (e.g., within an edge bead) substantially free of any support material backing that might otherwise impact radiative coupling of electromagnetic energy into the workpiece during a thermal process.

Figure 4B:
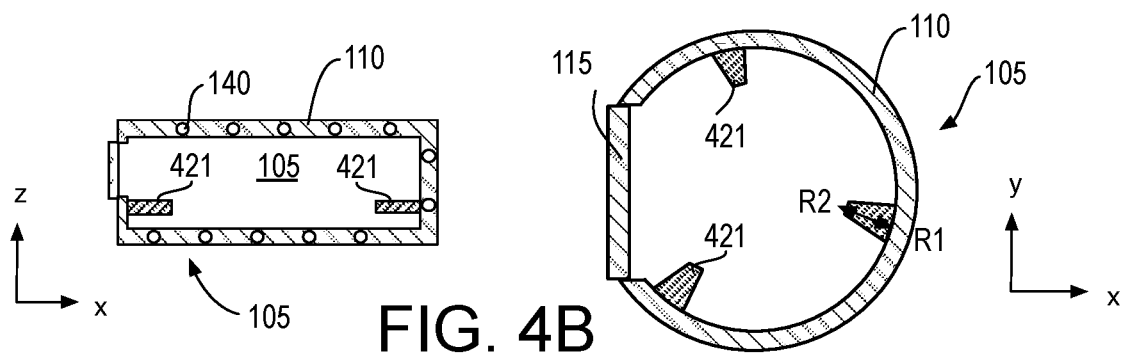

In FIG. 4B, workpiece support structure includes a plurality of pins 421 extending laterally form an interior of chamber wall 110 a radial distance R1-R2. Pins 421 may define a support plane (e.g., three contact points) upon which a workpiece may be supported during electromagnetic heating. The length and width of pins 421 may be selected to provide sufficient support while minimizing overlap with an outer annulus of a circular workpiece. In some embodiments, pins 421 overlap with less than <30% of a backside surface of a workpiece.

Figure 4C:
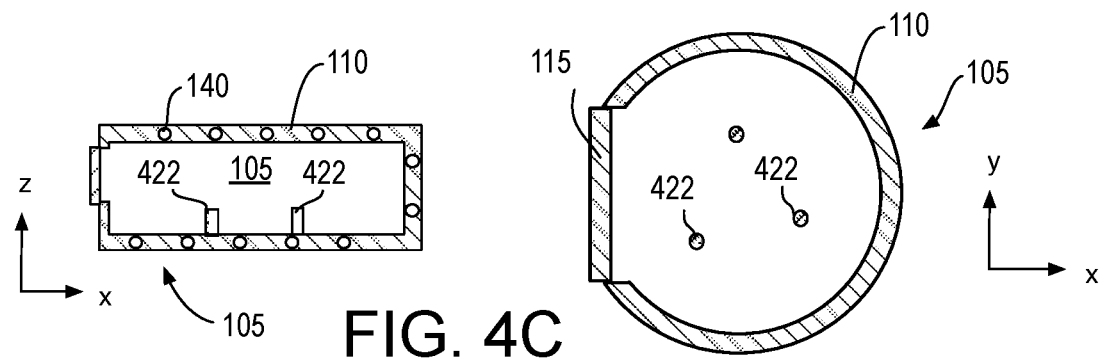

FIG. 4C illustrates a workpiece support structure including a plurality of pins 422 that extend upward form a bottom of thermal process chamber 105. Pins 422 may again define a support plane (e.g., three contact points) upon which a workpiece may be supported during electromagnetic heating. In some embodiments, pins 422 overlap with less than <30% of a backside surface of a workpiece. In an elevated position, pins 422 may have any vertical height or length needed for good radiative coupling and/or to reduce heat transfer from a workpiece during a radiative heating process. Following a thermal process, pins 422 may be lowered to cool the workpiece through conductive heat transfer to process chamber 105.

Figure 4D:
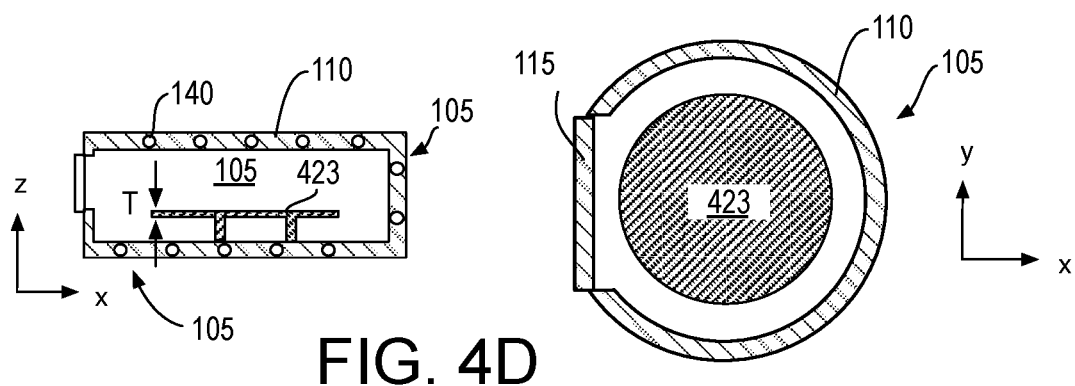

For the exemplarily embodiments illustrated in FIGS. 4A-4C where a workpiece support structure has minimal overlap with a workpiece, the workpiece support structure may comprise any material having a low coupling efficiency with the electromagnetic energy conveyed into thermal process chamber 105. The workpiece may therefore advantageously couple with the electromagnetic energy more strongly than any component of thermal process chamber 105, including the workpiece support. In alternative embodiments however, a workpiece support may instead have high coupling efficiency with the electromagnetic energy conveyed into thermal process chamber 105. Such embodiments may be practiced, for example, where a workpiece does not include a material that will strongly couple with a supplied electromagnetic energy. The workpiece may instead be indirectly heated by radiatively heating the workpiece support, which than transfers heat to the workpiece through a conductive and/or convective mechanism. For embodiments where the workpiece support is to be remotely heated, the workpiece support may be of a material having high electromagnetic energy absorbance and the workpiece support will advantageously have a high contact surface area. FIG. 4D illustrates one example where a workpiece support comprises a pedestal 423 having an area that overlaps more than 90% (e.g., 100%) of a backside surface of a workpiece during a thermal process. As further shown in the cross-sectional view, pedestal 423 may have a minimal thickness T (e.g., of a few millimeters) over a majority of the pedestal area, for example to improve radiative coupling and/or reduce thermal mass of pedestal 423.

Figure 5:
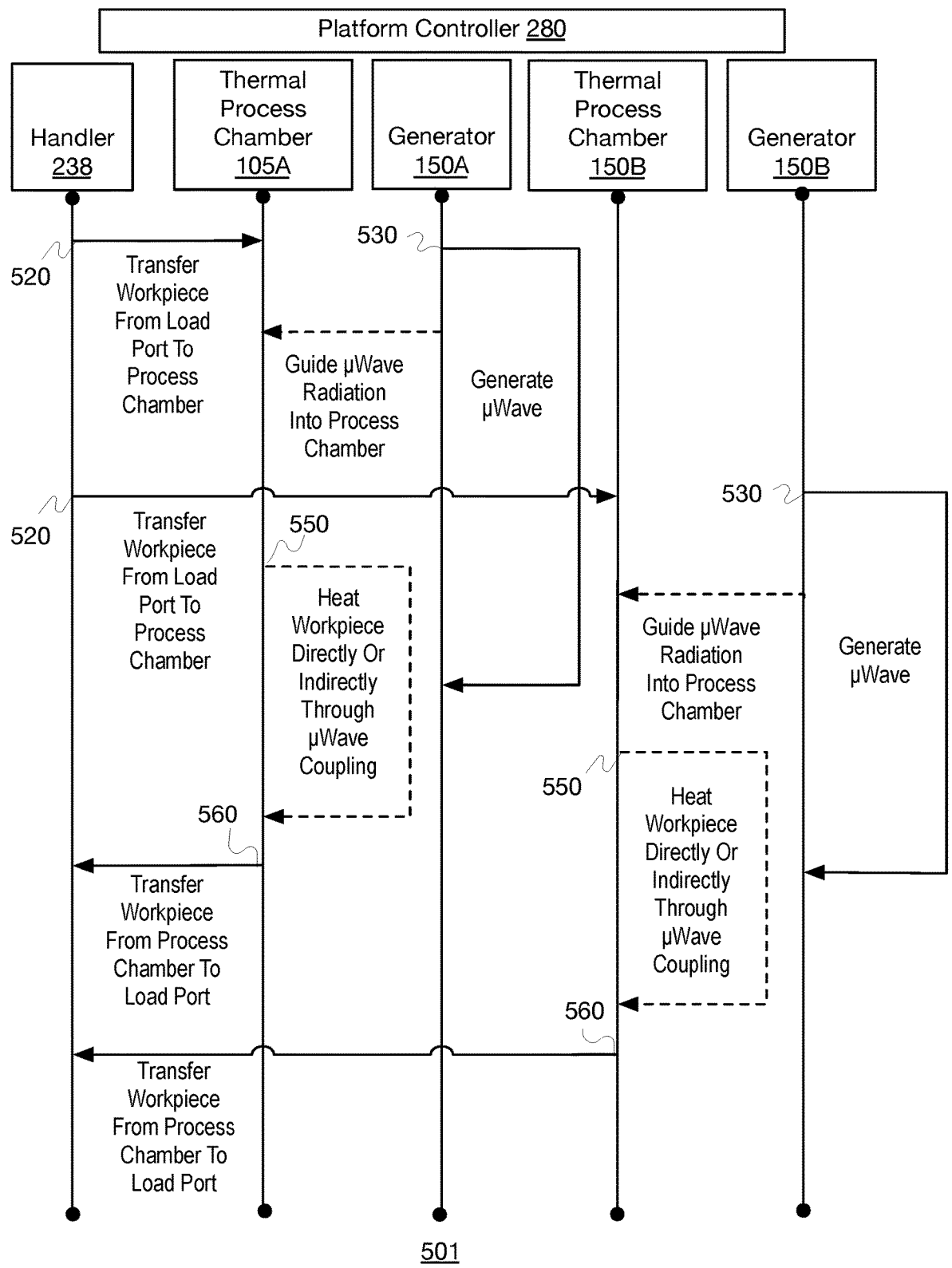
FIG. 5 is a flow diagram illustrating methods for remote radiative workpiece heating within a stacked thermal process chamber module, in accordance with some embodiments.

FIG. 5 is a flow diagram illustrating methods 501 for remote radiative heating of workpieces within a stacked thermal process chamber module, in accordance with some embodiments. Methods 501 may be practiced by thermal process platform 201 (FIG. 2), for example. However, an alternative thermal process platform may be employed to practice methods 501. Likewise, methods 501 are not the only methods that may be practiced by thermal process platform 201.

Methods 501 begin at operation 520 where a workpiece is transferred to a thermal process chamber. Operation 520 may be iterated any number of times to similarly transfer a plurality of workpieces into available thermal process chambers within a stack of such chambers. In one exemplary embodiment, robotic handler 238 performs operation 520, transferring a first of a plurality of workpieces into an interior of process chamber 105A in a stacked thermal process chamber module. Robotic handler 238 may then repeat operation 520, for example transferring a second of a plurality of workpieces into an interior of process chamber 105B in the stacked thermal process chamber module.

Methods 501 continue at block 530 where a remote RF generator is energized and electromagnetic (e.g., microwave) radiation is output from the generator, through a waveguide, and into a process chamber containing a workpiece to be heated. In one exemplary embodiment, generator 150A performs operation 530 and a waveguide coupled to an output of generator 150A propagates modes of the electromagnetic radiation into thermal process chamber 105A. Generator 150A may be controlled, for example by platform controller 280, to output radiation at a first selectable center wavelength suitable for radiatively heating one or more first materials that are present in the first workpiece contained within thermal process chamber 105A. Generator 150A may be further controlled to output a predetermined power level for a predetermined duration. Alternatively, operating parameters of generator 150A may be varied according to a dynamic control loop implemented, for example, by platform controller 280.

Generator 150B may likewise perform operation 530, and a waveguide coupled to an output of generator 150B similarly propagates modes of the electromagnetic radiation into thermal process chamber 105B. Generator 150B may be controlled, for example by platform controller 280, to output radiation at a second selectable center wavelength that is different than that output by generator 150A. The second selectable center wavelength may be more suitable, for example, to radiatively heat one or more second materials that are present in the second workpiece contained within thermal process chamber 105A. Generator 150B may be further controlled to output a predetermined power level for a predetermined duration. Alternatively, operating parameters of generator 150B may be varied according to a dynamic control loop implemented, for example, by platform controller 280.

Upon coupling with the propagated radiation, the first workpiece contained within thermal process chamber 105A is heated at operation 550. In some embodiments, the first workpiece is heated to a first temperature between 150° C. and 750° C. During the thermal process, the constituents and/or pressure of a gas within thermal process chamber 105A may be controlled concurrently with generator 150A, for example by platform controller 280, according to any known techniques as embodiments are not limited in this respect. Any process that is thermally activated may occur at operation 550 within various regions of workpiece 125. For example, a photoresist may be baked or cured at operation 550. Other thin film dielectric materials may be cured, or a metal may be reacted (e.g., silicided) at operation 550. In still other embodiments, a semiconductor dopant may be activated during operation 550, or microstructural damage may be annealed from regions of a workpiece.

Heating of the workpiece over a duration of operation 550 may be direct, through a radiative mechanism (e.g., through molecule rotation, or through ionic conduction). Alternatively, the workpiece may indirectly heated from a component within the process chamber (e.g., a workpiece support) that is radiatively heated by the electromagnetic radiation. The second workpiece contained within thermal process chamber 105B may be similarly heated indirectly or directly through a radiative heating mechanism. In some embodiments, the second workpiece is heated to a second temperature between 150° C. and 750° C. During the thermal process, the constituents and/or pressure of a gas within thermal process chamber 105B may be controlled concurrently with generator 150B.

Methods 501 then complete with transferring a workpiece from the thermal process chamber following the thermal process. In the example illustrated in FIG. 5, at operation 560, handler 238 collects the first workpiece from thermal process chamber 105A and collects the second workpiece from thermal process chamber 105B. Handler 238 may further transfer the workpieces to a carrier or pod on a load port, for example. The transfer may be performed after a cooling period during which an elevated temperature of the workpiece is allowed to decline in absence of electromagnetic radiation. In some embodiments, thermal conduction between the workpiece and the thermal process chamber may be increased, for example by repositioning a workpiece support within the thermal process chamber following a radiative heating process. Heat may transferred from the workpiece may be extracted from the process chamber through a temperature controlled coolant fluid loop, for example.

Figure 6:
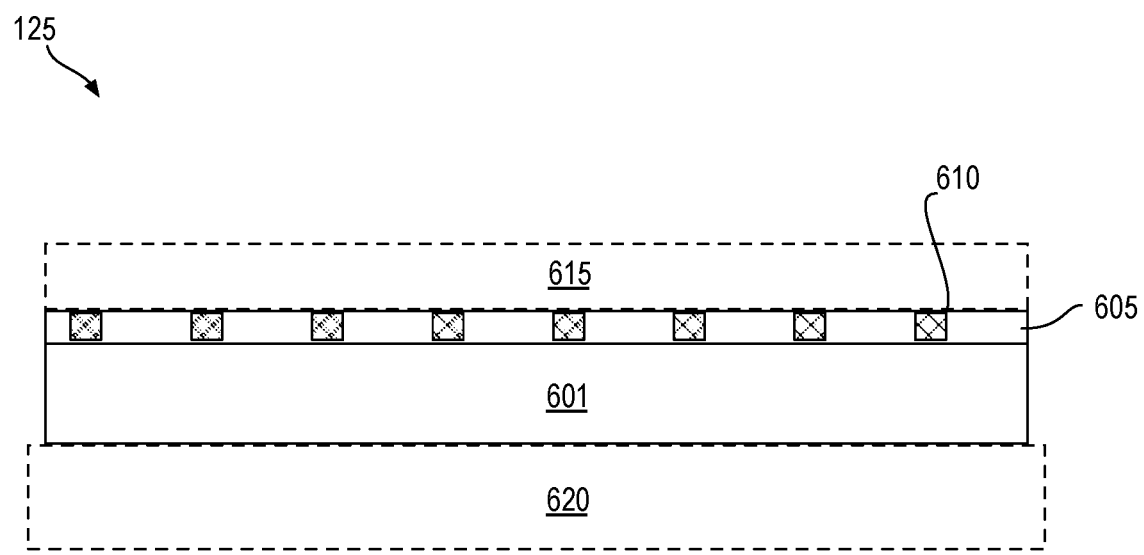
FIG. 6 illustrates a cross-sectional view of a workpiece suitable for the remote radiative heating methods illustrated in FIG. 5, in accordance with some embodiments.

The thermal process chambers, multi-chamber modules, multi-module platforms and thermal processes implemented by such chambers, modules and platforms may be applicable to wide variety of workpieces. FIG. 6 illustrates a cross-sectional view of workpiece 125, in accordance with some semiconductor device wafer embodiments. A semiconductor device wafer may have a diameter of 200, 300 mm, or 450 mm, for example. A semiconductor device wafer may include many thin film material layers 605 and/or thin film material features 610 over a front side and/or a back side of a substrate material 601. In some exemplary embodiments, substrate material 601 is a crystalline semiconductor including one or more Group IV elements and alloys (e.g., Si, Ge, SiGe, SiC, etc.), or Group III-V semiconductor elements and alloys (e.g., InP, InAs, GaAs, GaN, GaAlAs, etc.). Various ones of these crystalline semiconductor materials may couple to electromagnetic (e.g., microwave) radiation of a given wavelength more or less strongly as a function of their composition and/or microstructure. For example, a substrate material 601 comprising predominantly (poly)crystalline silicon will be substantially transparent to microwave radiation while a substrate material comprising predominantly (poly) crystalline SiC will display strong coupling to some bands of microwave radiation. Substrate material 601 may further include an embedded dielectric material layer. Such semiconductor on insulator (SOI) substrate materials may also have stronger or weaker coupling with electromagnetic radiation.

Thin film material layers 605 and/or thin film material features 610 may include one or more device layers including a semiconductor material, one or more interconnect levels interconnecting devices of the device layers into an IC, or one or more interlevel dielectric materials (ILDs). Generally, polar materials including many amorphous semiconductor materials (e.g., α-silicon), most dielectrics (e.g., SiO, SiOC, SiON, hydrogen silsesquioxane, methyl silsesquioxane, polyimide, polynorbornenes, benzocyclobutene), and many photoresists (e.g., PMMA, novolac resins, DNQ) may be heated through radiative mechanisms when exposed to electromagnetic energy with a suitable wavelength (e.g., in the far infrared and microwave regions of the electromagnetic spectrum). Most metals, if sufficiently thin (e.g., less than ~4 μm), can also be heated through radiative mechanisms when exposed to electromagnetic energy with a suitable wavelength. Materials comprising mobile ions may also be heated through ionic transport (conduction) induced by electromagnetic energy. For targeting a particular film composition, an RF generator center frequency may be selected based on one or more material analysis techniques, such as Fourier-transform infrared spectroscopy (FTIR), to identify frequency bands where excitation (absorption and emission) is greatest for the material.

With a wide range of materials typically present within a semiconductor device wafer, radiative heating within the workpiece may be selective with greater heating occurring where energy couples directly into molecular species of a given material rather than through conduction/convection through a bulk of the workpiece. Higher temperatures will occur in regions where direct energy transfer occurs. Increased reaction and/or material modification rates may occur within these regions.

During a thermal process performed in accordance with embodiments herein, one or more of substrate material 601, thin film material layer 605, or thin film material features 610 may be heated throughout its volume by a radiative mechanism (e.g., molecular rotation or ionic conduction) when exposed to electromagnetic energy. The material electromagnetically heated may be the same material and/or region of workpiece 125 that is to undergo modification (e.g., cure) during the thermal process, or the material that is to be modified may be in close proximity to another material and/or region of workpiece 125 that is electromagnetically heated. Hence, as long as one of substrate material 601, thin film material layer 605, or thin film material features 610 may be heated through radiative mechanisms when exposed to electromagnetic energy, other portions of workpiece 125 (e.g., substrate material 601) may be heated through other mechanisms (e.g. conduction/convection).

In some embodiments, a thin film material that will couple strongly to a particular type of electromagnetic energy may be applied to the front side or the back side of a workpiece. An intentional deposition of a "microwaveable" material may enable a workpiece that is otherwise substantially transparent to such energy to be thermally processed through a long wavelength radiative oven. In FIG. 6, for example, thin film material layer 615 is illustrated in dashed line to represent a sacrificial material that may be deposited onto a top side (or back side) surface of workpiece 125. Thin film material layer 615 may be of a particular composition (e.g., comprising molecules with high dipole momentum), and/or microstructure (e.g., amorphous), and/or thickness that will most efficiently couple to electromagnetic energy of a particular center wavelength. Thin film material layer 615 may then be radiatively heated by the electromagnetic energy during thermal processing of workpiece 125 as a means of indirectly heating one or more of substrate material 601, thin film material layer 605, or thin film material features 610 through other mechanisms (e.g. conduction/convection).

In some other embodiments, a workpiece may include a carrier material that facilitates remote radiative heating of the workpiece. For example, in FIG. 6, a carrier 620 attached to a back side of substrate material 601 is illustrated in dashed line. Carrier 620 is again a sacrificial material that will not be present in a final IC device fabricated from workpiece 125. Instead, carrier 620 serves as a temporary component of workpiece 125 that will couple more strongly to an electromagnetic wave than does substrate material 601, thin film material layer 605, or thin film material features 610 retained within an IC device. Carrier 620 may be of a particular composition (e.g., comprising molecules with high dipole momentum), and/or microstructure (e.g., amorphous), and/or thickness that will most efficiently couple to electromagnetic energy of a particular center wavelength (e.g., within the microwave band). Carrier 620 may then be radiatively heated by the electromagnetic energy during thermal processing of workpiece 125 as a means of indirectly heating one or more of substrate material 601, thin film material layer 605, or thin film material features 610 through other mechanisms (e.g. conduction/convection).

Figure 7:
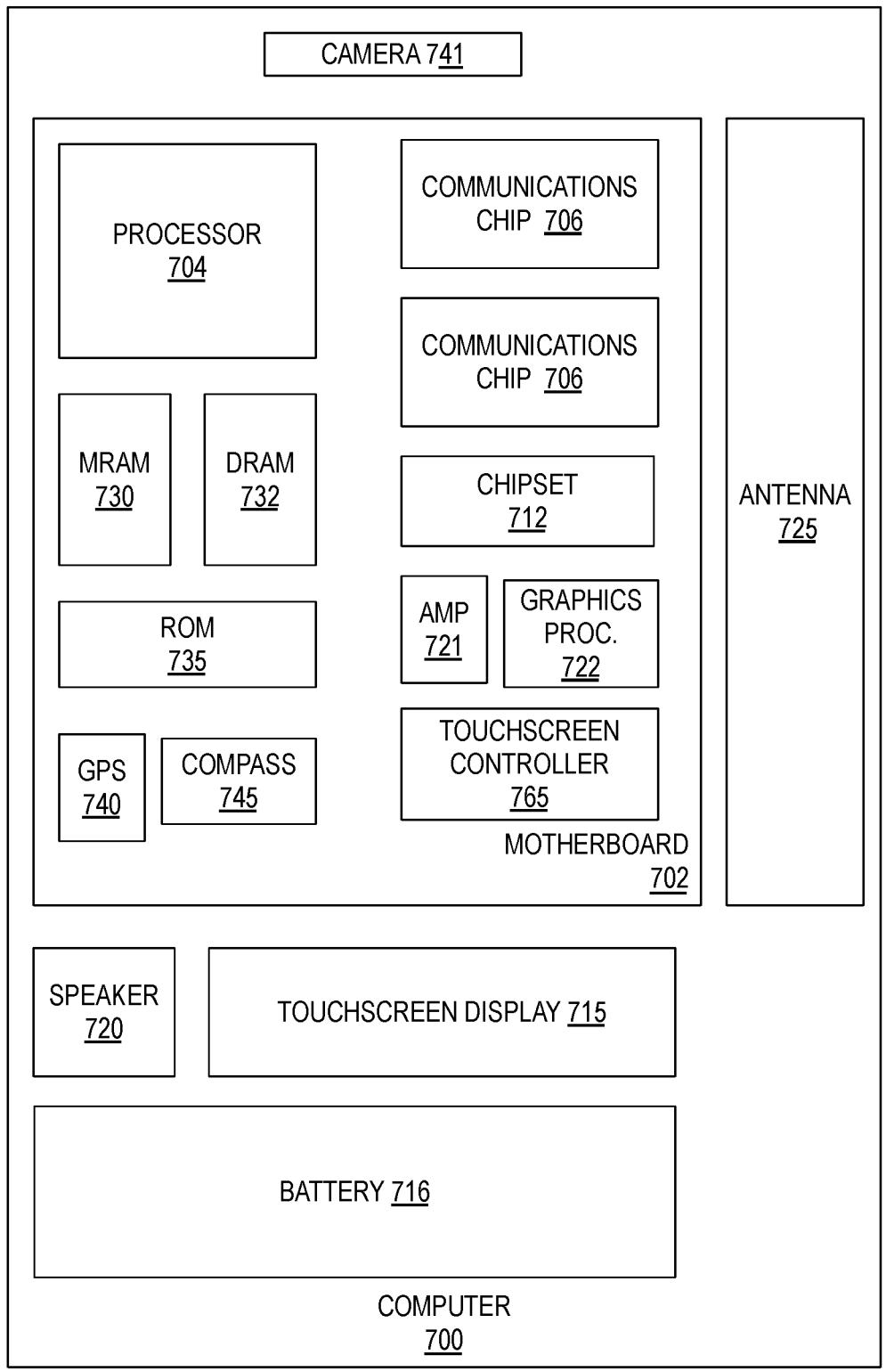
FIG. 7 is a functional block diagram of a thermal processing platform controller, in accordance with some embodiments.

FIG. 7 is a functional block diagram of an electronic computing device 700, in accordance with an embodiment of the present invention. Computing device 700 may be operative as module controller 180 or platform controller 280, for example. Device 700 further includes a motherboard 702 hosting a number of components, such as, but not limited to, a processor 704 (e.g., an applications processor). Processor 704 may be physically and/or electrically coupled to motherboard 702. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example the above embodiments may include specific combinations of features as further provided below.

In first examples, a thermal process chamber platform has a load port to hold a plurality of semiconductor device workpieces. The platform has a thermal process module including a vertical stack of process chambers. Individual ones in the stack of process chambers are to contain a single one of the workpieces within a chamber interior during a thermal process. The thermal process module includes a plurality of electromagnetic wave generators external of the stack of process chambers. The thermal process module includes plurality of waveguides. First ends of the waveguides are coupled to an output of individual ones of the generators, and second ends of the waveguides terminate at individual ones of the process chambers. The platform includes a transfer station coupled to the load port and to the thermal process module, the transfer station has a robotic handler to transfer workpieces between the load port and individual ones of the process chambers. The platform includes a module controller communicatively coupled to the thermal process module, the controller to cause the workpieces to be heated within individual ones of the process chambers by electromagnetic waves from the generators.

In second examples, for any of the first examples interior walls of the process chambers are reflective of electromagnetic waves to be output by the generators and conveyed through the waveguides.

In third examples, for any of the first through second examples the there is a workpiece support structure within the chamber interior, the workpiece support structure to overlap with less than 30% of a backside surface area of the workpiece during the thermal process.

In fourth examples, for any of the third examples the interior walls of the process chambers and the support structure are to absorb less electromagnetic energy conveyed through the waveguides than the workpiece during the thermal process.

In fifth examples, for any of the third through fourth examples the support structure comprises at least one of a support ring to contact an outer annulus of the workpiece during the thermal process, a plurality of pins extending upward from a bottom of the chamber to support the workpiece off the bottom of the chamber by a length of the pins, or a plurality of pins extending laterally from a wall of the chamber to support the workpiece over a bottom of the chamber.

In sixth examples, for any of the first through fifth examples individual ones of the generators output at least 5 kW of electromagnetic energy within a frequency band of 500 MHz to 10 GHz.

In seventh examples, for any of the first through sixth examples individual ones of the process chambers have a vertical height of no more than 20 cm, and the vertical stack comprises at least six process chambers.

In eighth examples, for any of the first through seventh examples one or more of the waveguides comprises a vertical run of at least 3 meters between the process chambers and the generators.

In ninth examples, for any of the first through eighth examples the thermal process chamber module further comprises a heat exchanger external of the stack of process chambers and coupled to one or more walls of the process chambers through a coolant fluid conduit loop, the heat exchanger to remove heat transferred to the coolant fluid from the walls of the process chambers. The chamber module further comprises a process gas supply external of the stack of process chambers and coupled into the interior of the chamber, and a pressure controller to maintain a pressure of 0.5-1.5 standard atm within the chamber interior during the thermal process.

In tenth examples, for any of the ninth examples the process gas supply comprises at least one of $N_2$ or $H_2$.

In eleventh examples, the platform further comprises a workpiece support structure within the chamber interior, the workpiece support structure to overlap with more than 90% of a backside surface of the workpiece during the thermal process, and wherein the workpiece support structure is to absorb more electromagnetic energy than the interior walls of the process chambers.

In twelfth examples, for any of the first through eleventh examples the thermal process module is a first thermal process module, and wherein the platform further comprises one or more additional process modules, each of the additional process modules further comprising another vertical stack of the thermal process chambers, and the one or more additional process modules are coupled to the transfer station.

In thirteenth examples, a method of thermally processing semiconductor device workpieces comprises transferring a first of a plurality of workpieces from a load port to an interior of a first process chamber of a module comprising a vertical stack of thermal process chambers. Transferring a second of the workpieces from the load port to an interior of a second process chamber of the module and located above or below the first process chamber within the vertical stack. The method comprises heating the first of the workpieces by energizing a first electromagnetic wave generator coupled to the first process chamber through a first waveguide. The method comprises heating the second of the workpieces by energizing a second electromagnetic wave generator coupled to the second process chamber through a second waveguide. The method comprises transferring the first of the workpieces from the first process chamber to the load port. The method comprises transferring the second of the workpieces from the second process chamber to the load port.

In fourteenth examples, for any of the thirteenth examples, heating of the first the workpieces further comprises supporting the first of the workpieces within the interior of the first process chamber with a workpiece support contacting less than 30% of a backside surface area of the first of the workpieces, and propagating at least 5 kW of electromagnetic energy within a frequency band of 500 MHz to 10 GHz through the first waveguide.

In fifteenth examples, for any of the thirteenth through fourteenth examples the first of the workpieces comprises at least one of a first substrate material, a first thin film material on a front side or a back side of the substrate material, or a first carrier material on a back side of the substrate material that will undergo molecular rotation or ionic conduction in response to electromagnetic energy of a first center frequency conveyed through the first waveguide The heating the first of the workpieces is exclusively through the molecular rotation or ionic conduction in response to the electromagnetic energy of the first center frequency, and least one of the thin film material, the substrate material, or the carrier material reaches a temperature of at least 150° C. during the heating.

In sixteenth examples, for any of the thirteenth through fifteenth examples the second of the workpieces comprises at least one of a second substrate material, a second thin film material on a front side or a back side of the second substrate material, or a second carrier material on a back side of the second substrate material that will undergo molecular rotation or ionic conduction in response to electromagnetic energy of a second center frequency conveyed through the second waveguide. The heating the second of the workpieces is exclusively through the molecular rotation or ionic conduction in response to the electromagnetic energy of the second center frequency.

In seventeenth examples for any of the thirteenth through sixteenth examples the method further comprises maintaining walls of at least the first chamber at less than 30° C. during the heating with a coolant fluid loop coupled to a heat exchanger external to the chamber module. The method comprises flowing one or more process gases into the interior of the first chamber during the heating, and maintaining a pressure of 0.5 to 1.5 standard atm within the interior of the first chamber during the heating.

In eighteenth examples, for any of the thirteenth through seventeenth examples the method further comprises applying, to the front side or the back side of the first or second workpiece, a thin film material that will couple more strongly to the electromagnetic wave than does the substrate material, or attaching, to a back side of the substrate material, a carrier material that will couple more strongly to the electromagnetic wave than does the substrate material.

In nineteenth examples, a computer readable media comprises instructions stored thereon, which, when executed by a computerized platform controller, causes a thermal process chamber platform to perform a method comprising transferring a first of a plurality of workpieces from a load port to an interior of a first process chamber of a thermal process module comprising a vertical stack of thermal process chambers, transferring a second of the workpieces from the load port to an interior of a second process chamber of the module and located above or below the first process chamber within the vertical stack, heating the first of the workpieces by energizing a first electromagnetic wave generator coupled to the first process chamber through a first waveguide, heating the second of the workpieces by energizing a second electromagnetic wave generator coupled to the second process chamber through a second waveguide, transferring the first of the workpieces from the first process chamber to the load port, and transferring the second of the workpieces from the second process chamber to the load port.

In twentieth examples, for any of the nineteenth examples the computer readable media further comprises instructions stored thereon, which when executed by the platform controller, causes the thermal process chamber platform to perform a method further comprising supporting the first of the workpieces within the interior of the first process chamber with a workpiece support contacting less than 30% of a backside surface area of the first of the workpiece during the heating, conveying at least 5 kW of electromagnetic energy within a frequency band of 500 MHz to 10 GHz through the first waveguide during the heating, flowing one or more process gases into the interior of the first chamber during the heating, and maintaining a pressure of 0.5 to 1.5 standard atm within the interior of the first chamber during the heating.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A thermal process chamber platform comprising:
    a load port to hold a plurality of semiconductor device workpieces;
    a thermal process module comprising:
        a vertical stack of process chambers, wherein individual ones in the stack of process chambers to contain a single one of the workpieces within a chamber interior during a thermal process;
        a plurality of electromagnetic wave generators external of the stack of process chambers; and
        a plurality of waveguides, wherein first ends of the waveguides are coupled to an output of individual ones of the generators, and second ends of the waveguides terminate at individual ones of the process chambers;
    a transfer station coupled to the load port and to the thermal process module, the transfer station comprising a robotic handler to transfer workpieces between the load port and individual ones of the process chambers; and
    a module controller communicatively coupled to the thermal process module, the controller to cause the workpieces to be heated within individual ones of the process chambers by electromagnetic waves from the generators.

2. The thermal process chamber platform of claim 1, wherein interior walls of the process chambers are reflective of electromagnetic waves to be output by the generators and conveyed through the waveguides.

3. The thermal process chamber platform of claim 2, further comprising a workpiece support structure within the chamber interior, the workpiece support structure to overlap with less than 30% of a backside surface area of the workpiece during the thermal process.

4. The thermal process chamber platform of claim 3, wherein the interior walls of the process chambers and the support structure are to absorb less electromagnetic energy conveyed through the waveguides than the workpiece during the thermal process.

5. The thermal process chamber platform of claim 3, wherein the support structure comprises at least one of:
    a support ring to contact an outer annulus of the workpiece during the thermal process;
    a plurality of pins extending upward from a bottom of the chamber to support the workpiece off the bottom of the chamber by a length of the pins; or
    a plurality of pins extending laterally from a wall of the chamber to support the workpiece over a bottom of the chamber.

6. The thermal process chamber platform of claim 1, wherein individual ones of the generators output at least 5 kW of electromagnetic energy within a frequency band of 500 MHz to 10 GHz.

7. The thermal process chamber platform of claim 1, wherein individual ones of the process chambers have a vertical height of no more than 20 cm, and the vertical stack comprises at least six process chambers.

8. The thermal process chamber platform of claim 1, wherein one or more of the waveguides comprises a vertical run of at least 3 meters between the process chambers and the generators.

9. The thermal process chamber platform of claim 1, wherein the thermal process chamber module further comprises:
    a heat exchanger external of the stack of process chambers and coupled to one or more walls of the process chambers through a coolant fluid conduit loop, the heat exchanger to remove heat transferred to the coolant fluid from the walls of the process chambers;
    a process gas supply external of the stack of process chambers and coupled into the interior of the chamber; and
    a pressure controller to maintain a pressure of 0.5-1.5 standard atm within the chamber interior during the thermal process.

10. The thermal process chamber platform of claim 9, wherein the process gas supply comprises at least one of $N_2$ or $H_2$.

11. The thermal process chamber platform of claim 9, further comprising a workpiece support structure within the chamber interior, the workpiece support structure to overlap with more than 90% of a backside surface of the workpiece during the thermal process, and wherein the workpiece support structure is to absorb more electromagnetic energy than the interior walls of the process chambers.

12. The thermal process chamber platform of claim 1, wherein the thermal process module is a first thermal process module, and wherein the platform further comprises one or more additional process modules, each of the additional process modules further comprising another vertical stack of the thermal process chambers, and wherein the one or more additional process modules are coupled to the transfer station.

* * * * *